United States Patent
Oki et al.

(10) Patent No.: US 11,040,887 B2
(45) Date of Patent: Jun. 22, 2021

(54) SPINEL PARTICLES, METHOD FOR PRODUCING SAME AND COMPOSITION AND MOLDED ARTICLE INCLUDING SPINEL PARTICLES

(71) Applicant: DIC Corporation, Tokyo (JP)

(72) Inventors: Hironobu Oki, Sakura (JP); Kazuo Itoya, Sakura (JP); Masaki Iida, Sakura (JP); Jian-Jun Yuan, Sakura (JP); Hiroshi Kinoshita, Sakura (JP)

(73) Assignee: DIC Corporation, Tokyo (JP)

( * ) Notice: Subject to any disclaimer, the term of this patent is extended or adjusted under 35 U.S.C. 154(b) by 203 days.

(21) Appl. No.: 16/310,942

(22) PCT Filed: Jun. 23, 2016

(86) PCT No.: PCT/JP2016/068665
§ 371 (c)(1),
(2) Date: Dec. 18, 2018

(87) PCT Pub. No.: WO2017/221372
PCT Pub. Date: Dec. 28, 2017

(65) Prior Publication Data
US 2020/0308014 A1    Oct. 1, 2020

(51) Int. Cl.
*C01F 7/00* (2006.01)
*C01F 7/16* (2006.01)
*C30B 9/10* (2006.01)

(52) U.S. Cl.
CPC .......... *C01F 7/162* (2013.01); *C01P 2002/32* (2013.01); *C01P 2002/52* (2013.01); *C01P 2002/60* (2013.01); *C01P 2002/74* (2013.01); *C01P 2004/62* (2013.01); *C01P 2004/64* (2013.01); *C01P 2006/32* (2013.01); *C30B 9/10* (2013.01)

(58) Field of Classification Search
CPC .. C01F 7/162; C01P 2002/32; C01P 2002/54; C01P 2002/60; C01P 2002/74; C01P 2004/61; C01P 2004/62; C01P 2006/32; C30B 9/10; C30B 29/26; C08K 3/08; C08K 3/18; C08K 3/105; C08K 3/2217; C08K 3/2255; C08K 3/222; C08K 3/2224; C08K 3/2227
See application file for complete search history.

(56) References Cited

U.S. PATENT DOCUMENTS

| | | | | | |
|---|---|---|---|---|---|
| 3,248,241 | A | * | 4/1966 | El Rifai | C04B 35/65 501/127 |
| 3,320,036 | A | * | 5/1967 | Scruggs | C22C 32/00 75/234 |
| 3,417,301 | A | * | 12/1968 | Guido | G02F 1/03 359/245 |
| 3,493,430 | A | * | 2/1970 | Manasevit | H01L 21/00 428/471 |
| 8,163,667 | B2 | * | 4/2012 | Clauss | G02B 1/02 501/120 |
| 10,683,212 | B2 | * | 6/2020 | Oki | C09K 5/14 |
| 2006/0029811 | A1 | | 2/2006 | Sugioka et al. | |

FOREIGN PATENT DOCUMENTS

| | | |
|---|---|---|
| CN | 1048843 A | 1/1991 |
| JP | 2001-048529 A | 2/2001 |
| JP | 2003-267777 A | 9/2003 |
| JP | 2004-027177 A | 1/2004 |
| JP | 2007-070608 A | 3/2007 |
| JP | 2016-17125 A | 2/2016 |
| WO | 2013/039103 A1 | 3/2013 |

OTHER PUBLICATIONS

International Search Report and Written Opinion dated May 24, 2016, issued in International Application No. PCT/JP2016/058498. (w/ partial English translation). (cited in the related U.S. Appl. No. 15/559,018).

* cited by examiner

*Primary Examiner* — Steven J Bos
(74) *Attorney, Agent, or Firm* — Locke Lord LLP; James E. Armstrong, IV; Nicholas J. DiCeglie, Jr.

(57) ABSTRACT

Alumina is generally used as an inorganic filler, while spinel, which is known to be lower in thermal conductivity than alumina, is used in applications such as gems, fluorescence emitters, catalyst carriers, adsorbents, photocatalysts and heat-resistant insulating materials, but not expected to be used as a thermally conductive inorganic filler. Thus, an object of the invention is to provide spinel particles having excellent thermal conductive properties. The invention relates to a spinel particle including magnesium, aluminum and oxygen atoms and molybdenum and having a [111] plane crystallite diameter of 220 nm or more.

17 Claims, 3 Drawing Sheets

[Fig. 1]
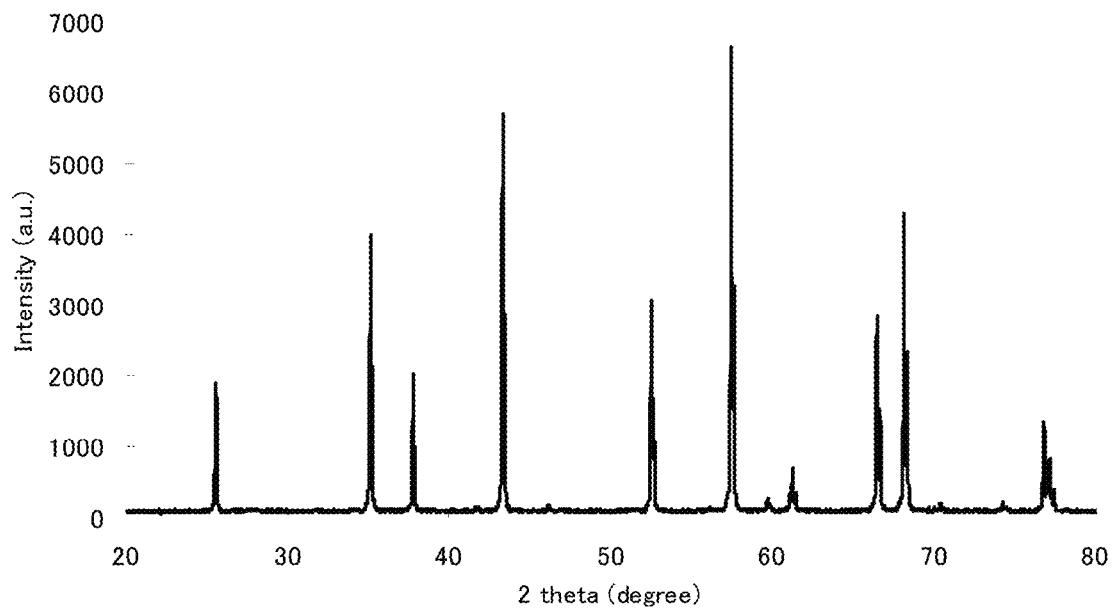
[Fig. 2]
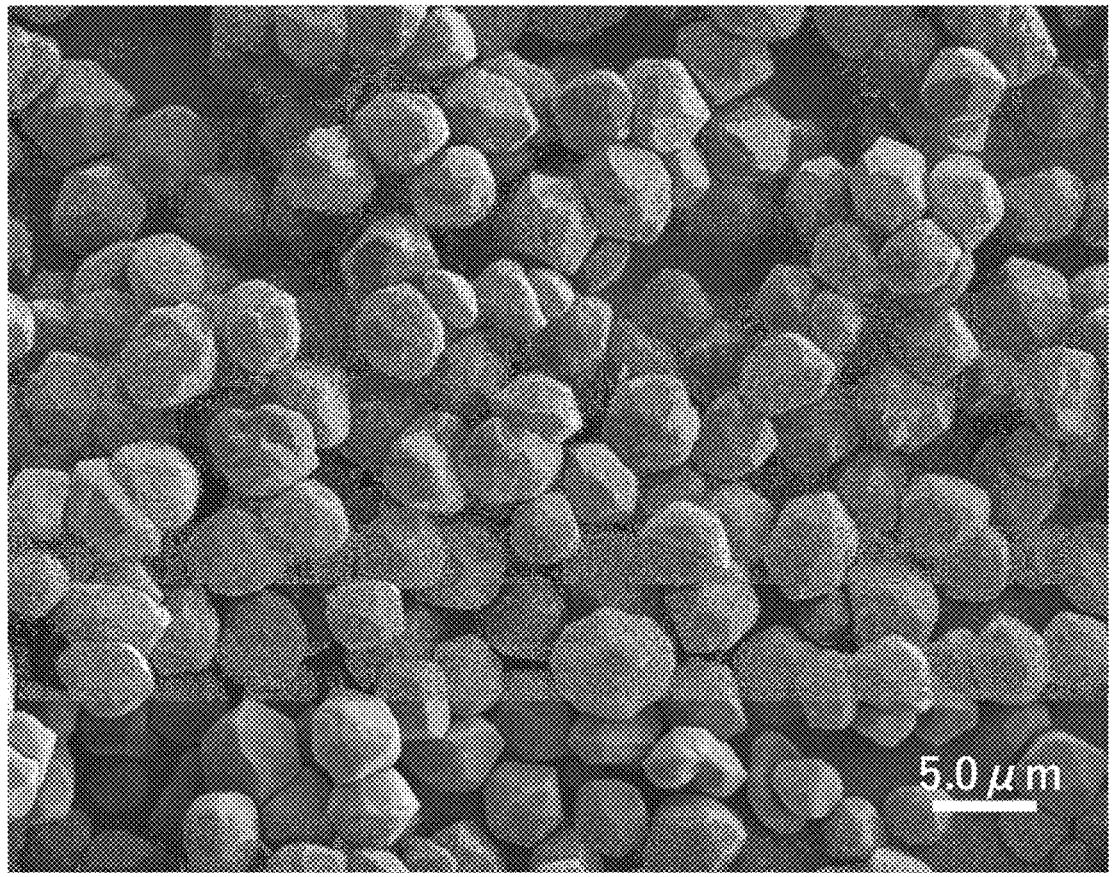

[Fig. 3]
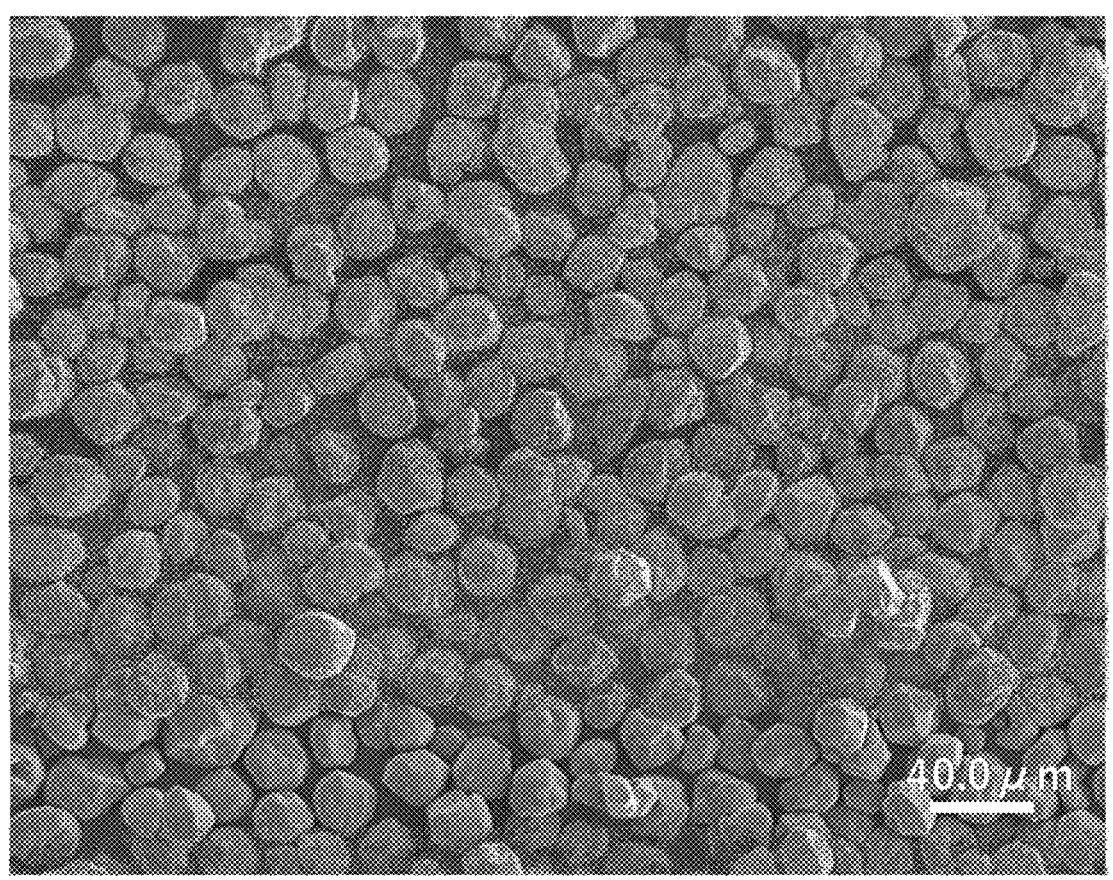
[Fig. 4]
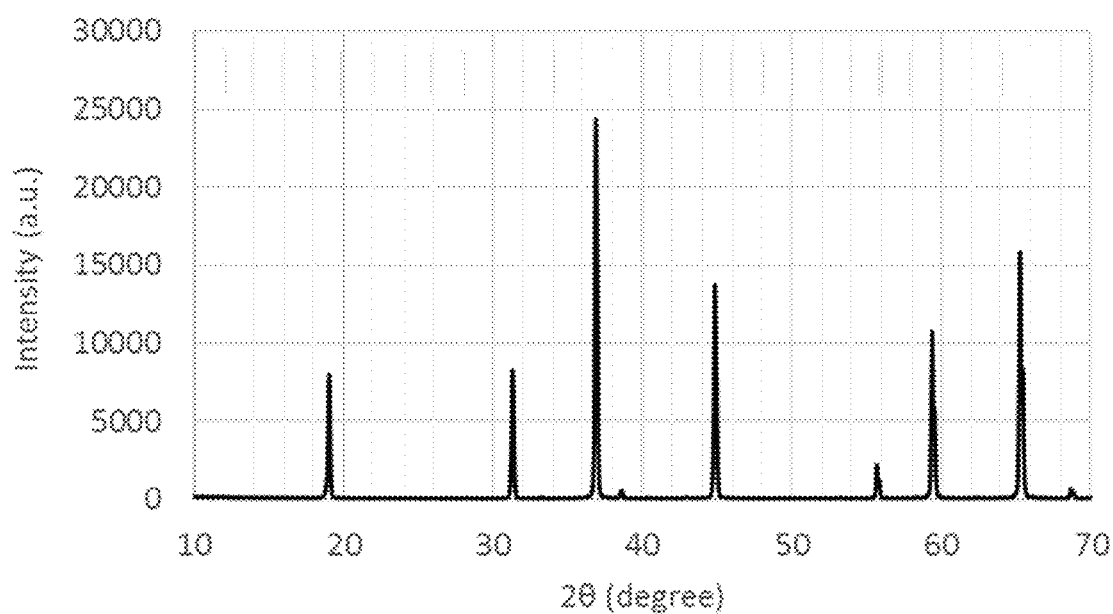

【Fig. 5】
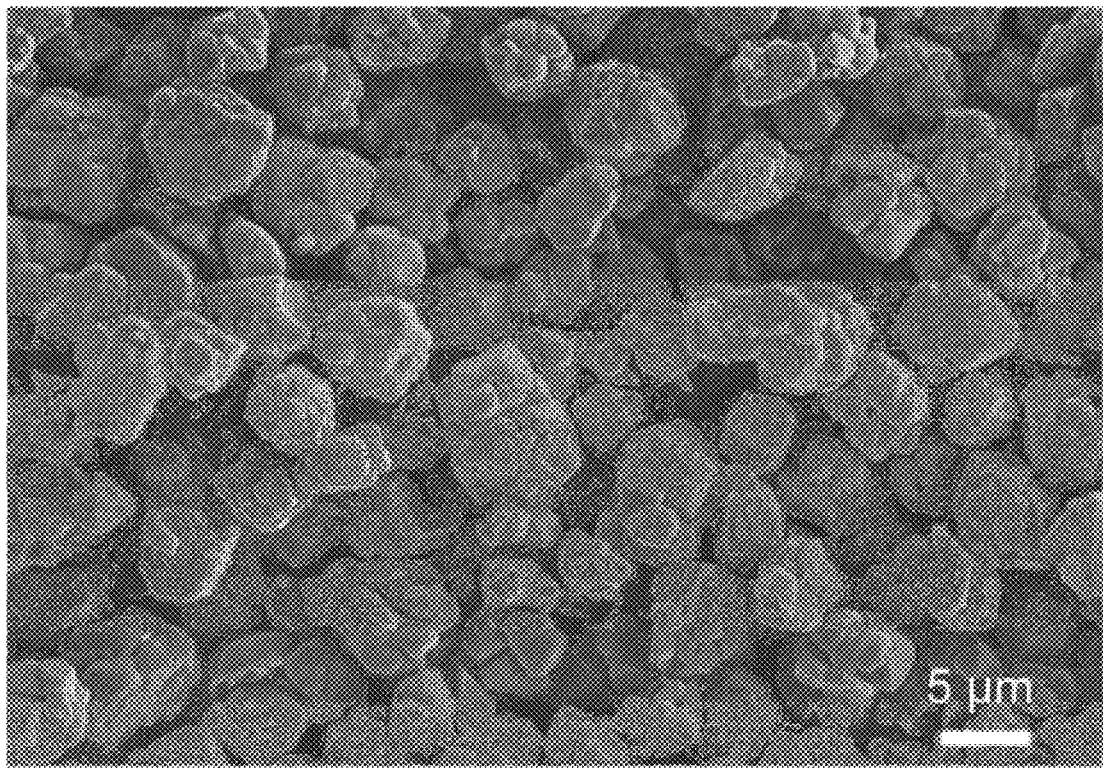
【Fig. 6】
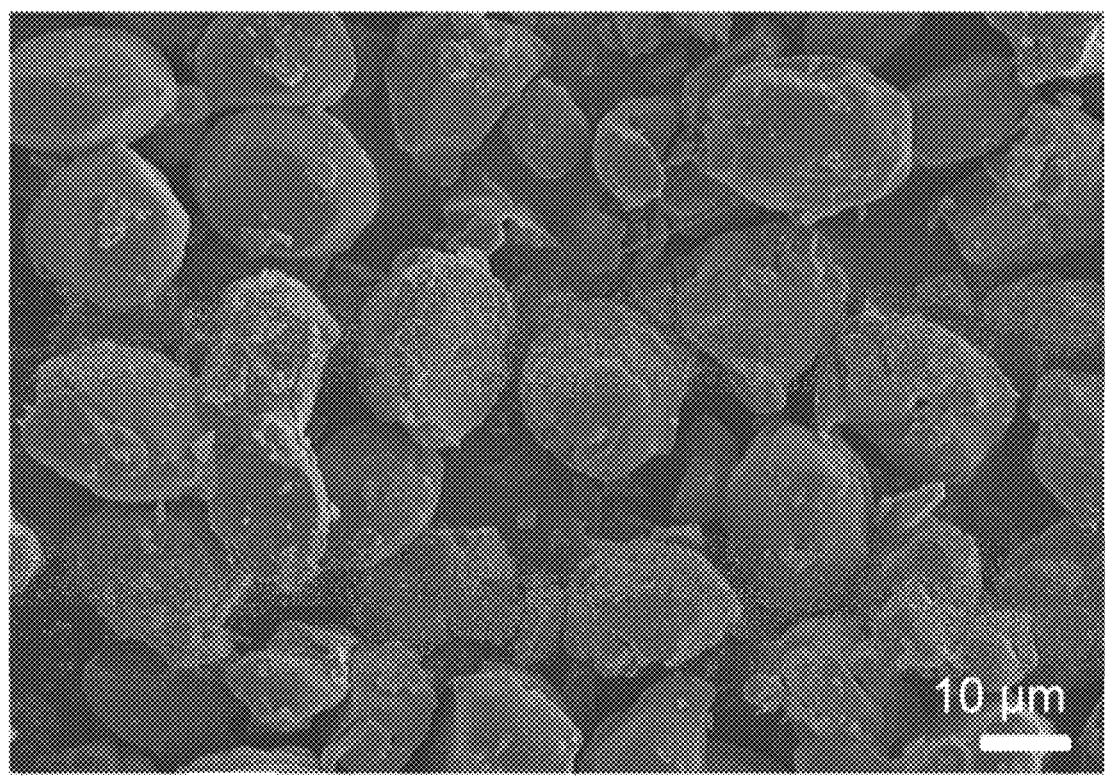

US 11,040,887 B2

SPINEL PARTICLES, METHOD FOR PRODUCING SAME AND COMPOSITION AND MOLDED ARTICLE INCLUDING SPINEL PARTICLES

TECHNICAL FIELD

The present invention relates to a spinel particle, a method for producing the same and a composition and a molded article including the spinel particles.

BACKGROUND ART

Conventionally, electric devices have been required to be reduced in size and weight and improved in performance, and, in accordance with such a tendency, semiconductor devices are increased in the integration degree and capacity. Therefore, the amount of heat generated in members constituting the electric device is increased, and the electric device is desired to be improved in the heat dissipation function.

As a method for improving the electric device in heat dissipation function, for example, there can be mentioned a method of imparting thermal conductive properties to an insulating member, and more specifically, a method of adding an inorganic filler to a resin constituting an insulating member has been known. Examples of inorganic fillers used in this method include alumina (aluminum oxide), boron nitride, aluminum nitride, magnesium oxide and magnesium carbonate.

In recent years, electric devices are further reduced in size and weight and improved in performance, and inorganic fillers having high thermal conductivity are desired.

By the way, spinel is a mineral generally represented by a chemical composition: $MgAl_2O_4$ and is used as gems. Further, from the viewpoint of the porous structure and easy modification, spinel is used in applications, such as fluorescence emitters, catalyst carriers, adsorbents, photocatalysts and heat-resistant insulating materials.

For example, PTL 1 has a description about an invention of an oxide fluorescence emitter which is an Mn-doped $AB_2O_4$ spinel oxide having an A site element of Mg and a B site element of Al or Ga and containing Mg in an excess amount exceeding the stoichiometric ratio. The oxide fluorescence emitter is characterized in that, when the B site element is Al, the excess amount of Mg is in the range of 0.1 or more and 0.7 or less in terms of the stoichiometric ratio to A in the $AB_2O_4$ spinel oxide, and the Mn doping amount is in the range of 0.05 mol % or more and 0.2 mol % or less based on the $AB_2O_4$ spinel oxide. Moreover, when the B site element is Ga, the excess amount of Mg is in the range of 0.1 or more and 0.9 or less in terms of the stoichiometric ratio to A in the $AB_2O_4$ spinel oxide, and the Mn doping amount is in the range of 0.025 mol % or more and 0.2 mol % or less based on the $AB_2O_4$ spinel oxide. It is mentioned that, according to the oxide fluorescence emitter of PTL 1, red fluorescence can be emitted when the Mn-doped spinel oxide has a certain structure.

In this regard, PTL 1 discloses that the oxide fluorescence emitter can be produced by mixing and firing the raw materials by a solid phase reaction method or a solution method.

CITATION LIST

Patent Literature

PTL 1: JP-A-2016-17125

SUMMARY OF INVENTION

Technical Problem

Spinel has conventionally been used as mentioned above in applications, such as gems, fluorescence emitters, catalyst carriers, adsorbents, photocatalysts and heat-resistant insulating materials and is not expected to be used in an application as an inorganic filler having thermal conductive properties. The reason for this is that, from the viewpoint of the cost, conventionally, alumina has been generally used as an inorganic filler, and spinel known to be lower in thermal conductivity than alumina has not been expected to be used as a thermally conductive inorganic filler.

Accordingly, an object of the present invention is to provide spinel particles having excellent thermal conductive properties.

Solution to Problem

The present inventors have conducted extensive and intensive studies with a view toward solving the above-mentioned problems. As a result, it has been found that the problems can be solved by increasing the crystallite diameter of the spinel particle of a predetermined crystal plane, and therefore, the present invention has been completed.

Specifically, the invention relates to a spinel particle including magnesium, aluminum and oxygen atoms and molybdenum and having a [111] plane crystallite diameter of 220 nm or more.

Advantageous Effects of Invention

By the invention, spinel particles having excellent thermal conductive properties are provided.

BRIEF DESCRIPTION OF DRAWINGS

FIG. 1 is an X-ray diffraction pattern of the molybdenum-containing α-aluminum oxide synthesized in Synthesis Example 1.

FIG. 2 is a SEM image of the molybdenum-containing α-aluminum oxide particles synthesized in Synthesis Example 1.

FIG. 3 is a SEM image of the molybdenum-containing α-aluminum oxide particles synthesized in Synthesis Example 2.

FIG. 4 is an X-ray diffraction pattern of the spinel particles produced in Example 1.

FIG. 5 is a SEM image of the spinel particles produced in Example 1.

FIG. 6 is a SEM image of the spinel particles produced in Example 2.

DESCRIPTION OF EMBODIMENTS

Hereinbelow, embodiments for carrying out the present invention will be described in detail.
<Spinel Particle>

According to an embodiment of the invention, the spinel particle includes magnesium, aluminum and oxygen atoms and contains molybdenum. The crystallite diameter of the spinel particle of the [111] plane is 220 nm or more.

The "spinel particle" according to this embodiment includes magnesium, aluminum and oxygen atoms and thus is generally represented by the chemical composition: $MgAl_2O_4$. The spinel particle contains molybdenum. With respect to the state of the contained molybdenum, there is no particular limitation, and the state is a state in which molybdenum exists on the surface of the spinel particle in the state of adhering, coating or bonding onto the surface or in another state like that, a state in which molybdenum is incorporated into the spinel or a combination thereof. The "state in which molybdenum is incorporated into the spinel" is a state in which at least part of the atoms constituting the spinel particle is replaced by molybdenum, a state in which molybdenum exists in a space which can be present in the inside of the crystal of the spinel particle (including a space created by a defect in the crystal structure or the like) or the like. With respect to the atom constituting the spinel particle to be replaced in the state of replacement, there is no particular limitation, and the atom may be any of a magnesium atom, an aluminum atom, an oxygen atom and other atoms.

Of these states, molybdenum is preferably contained at least in the state in which molybdenum is incorporated into the spinel. When molybdenum is incorporated into the spinel, for example, there is a tendency towards difficulty in removal by washing.

The crystallite diameter of the spinel particle of the [111] plane is 220 nm or more, preferably 250 nm, more preferably 260 nm or more, further preferably 350 nm or more, especially preferably 400 nm or more. The [111] plane here is a major crystal domain of the spinel particle, and the size of the crystal domain of the [111] plane corresponds to the diameter of crystallites of the [111] plane. A large crystallite diameter means that the particle has high denseness and is highly crystalline and that the particle has no disordered portion in which scattering of phonons occurs, and therefore such particle is considered to have high thermal conductive properties. The crystallite diameter of the spinel particle of the [111] plane can be controlled by appropriately setting the conditions for the production method described below. In the present specification, with respect to the value of the "diameter of crystallites of the [111] plane", a value measured by the method described in the Examples is employed.

In an embodiment of the invention, the crystallite diameter of the spinel particle of the [311] plane is preferably 100 nm or more, more preferably 150 nm or more, further preferably 250 nm or more, especially preferably 500 nm or more, most preferably 600 nm or more. The [311] plane here is also a major crystal domain of the spinel particle, and the size of the crystal domain of the [311] plane corresponds to the diameter of crystallites of the [311] plane. A large crystallite diameter means that the particle has high denseness and is highly crystalline and that the particle has no disordered portion in which scattering of phonons occurs, and therefore such particle is considered to have high thermal conductive properties. The crystallite diameter of the spinel particle of the [311] plane can be controlled by appropriately setting the conditions for the production method described below. In the present specification, with respect to the value of the "diameter of crystallites of the [311] plane", a value measured by the method described in the Examples is employed.

The ratio of the crystalline peak intensity of the [111] plane to the crystalline peak intensity of the [311] plane of the spinel particle ([111]/[311]) is preferably 0.30 or more, more preferably 0.33 or more, further preferably 0.36 or more. In general, when the crystal of the spinel particle is to be grown by firing, the crystal planes of the spinel crystal tend to grow without any selectivity. However, because the crystal of the [111] plane does not easily grow in view of the energy, the value of the ratio of the crystalline peak intensity of the [111] plane to the crystalline peak intensity of the [311] plane ([111] plane/[311] plane) can be small (generally less than 0.30). According to an embodiment of the invention, however, the ratio of the peak intensities of [111] plane/[311] plane of the spinel particle can be made high by controlling the crystal growth. The crystallite diameter of the spinel particle of the [111] plane according to this embodiment is 220 nm or more, and when the ratio of the peak intensities of [111] plane/[311] plane of the spinel particle is 0.30 or more, higher thermal conductivity can be obtained. The [111] plane is a specific crystal plane and contributes to the formation of an octahedron surrounded by such specific crystal planes. Thus, when the ratio of the peak intensities of [111] plane/[311] plane of the spinel particle is 0.30 or more, the spinel particle can more easily form a polyhedral shape suitable for the dispersion in a resin. The value of the peak intensity ratio ([111]/[311]) can be controlled by appropriately adjusting the production method described below. In the present specification, with respect to the values of "the crystalline peak intensity of the spinel particle of the [311] plane and the crystalline peak intensity of the [111] plane" and "the ratio of the crystalline peak intensity of the [111] plane to the crystalline peak intensity of the [311] plane of the spinel particle ([111]/[311])", values measured by the methods described in the Examples are employed.

The average particle diameter of the spinel particles is preferably 0.1 to 1,000 µm, more preferably 0.2 to 100 µm, further preferably 0.3 to 80 µm, especially preferably 0.4 to 60 µm. When the average particle diameter of the spinel particles is 0.1 µm or more, the viscosity of a composition obtained by mixing the spinel particles with a resin is advantageously not increased excessively. On the other hand, the average particle diameter of the spinel particles is preferably 1,000 µm or less for example from the viewpoint of achieving a molded article having smooth surface and excellent mechanical properties wherein the molded article is obtained from a composition obtained by mixing the spinel particles with a resin. In the present specification, the term "particle diameter" means the largest length of the distances between two points on the line of contour of the particle, and the value of the "average particle diameter" means a value measured and calculated by the method described in the Examples.

Examples of shapes of the spinel particle include a polyhedral shape, a spherical shape, an ellipsoidal shape, a cylindrical shape, a polygonal prism shape, a needle-like shape, a rod shape, a plate form, a disk form, a flake form and a scale form. Of these, from the viewpoint of facilitating dispersion of the spinel particles in a resin, preferred are a polyhedral shape, a spherical shape, an ellipsoidal shape and a plate form, and more preferred are a polyhedral shape and a spherical shape. In the present specification, the term "polyhedral shape" means generally a shape of hexahedron or polyhedron having more than six faces, preferably octahedron or polyhedron having more than eight faces, more preferably a decahedron to triacontahedron.

The specific surface area of the spinel particle is preferably 10 m$^2$/g or less, more preferably 0.001 to 8 m$^2$/g, further preferably 0.01 to 5 m$^2$/g. When the specific surface area of the spinel particle is 10 m$^2$/g or less, the particle has excellent smoothness of the surface such that the particle can be advantageously dispersed in a resin or the like. In the present specification, the term "specific surface area" means a BET specific surface area, and a value measured by the method described in the Examples is employed.

As described above, the spinel particle contains a magnesium atom, an aluminum atom and an oxygen atom and is generally represented by a composition: $MgAl_2O_4$. The spinel particle also contains molybdenum. In addition, incidental impurities, other atoms or the like may be contained.

(Magnesium Atom)

With respect to the magnesium atom content of the spinel particle, there is no particular limitation, but, when the structural formula of the spinel particle is represented by $Mg_xAl_yO_z$, x is preferably in the range of from (y−1.2) to (y−0.8), more preferably in the range of from (y−1.1) to (y−0.9). In an embodiment, when a specific example of the y is 2, a specific example of the x is preferably 0.8 to 1.2, more preferably 0. 9 to 1.1. In the present specification, with respect to the magnesium atom content of the spinel particle, a value measured by inductively coupled plasma atomic emission spectroscopy (ICP-AES) is employed.

(Aluminum Atom)

With respect to the magnesium atom content of the spinel particle, there is no particular limitation, but, when the structural formula of the spinel particle is represented by $Mg_xAl_yO_z$, y is preferably in the range of from (x+0.8) to (x+1.2), more preferably in the range of from (x+0.9) to (x+1.1). In an embodiment, when a specific example of the x is 1, a specific example of the y is preferably 1.8 to 2.2, more preferably 1.9 to 2.1. In the present specification, with respect to the aluminum atom content of the spinel particle, a value measured by inductively coupled plasma atomic emission spectroscopy (ICP-AES) is employed.

(Oxygen Atom)

With respect to the oxygen atom content of the spinel particle, there is no particular limitation, but, when the structural formula of the spinel particle is represented by $Mg_xAl_yO_z$, z is preferably in the range of from (x+y+1.2) to (x+y+0.8), more preferably in the range of from (x+y+1.1) to (x+y+0.9). In an embodiment, when specific examples of the x and y are 1 and 2, respectively, a specific example of the z is preferably 3.8 to 4.2, more preferably 3.9 to 4.1.

(Molybdenum)

Molybdenum can be contained due to the following method for producing the spinel particle.

The molybdenum can be contained in the spinel particle in a state in which molybdenum exists on the surface of the spinel particle in the state of adhering, coating or bonding onto the surface or in another state like that, a state in which molybdenum is incorporated into the spinel or by a combination thereof.

The molybdenum includes a molybdenum atom and molybdenum in the molybdenum compound described below.

With respect to the molybdenum content, there is no particular limitation. However, from the viewpoint of achieving high thermal conductivity of the spinel particles, the molybdenum content in terms of molybdenum oxide based on the spinel particles is preferably 10% by mass or less, more preferably 5% by mass or less, and the molybdenum content is further preferably 1% by mass or less because the spinel particles have high denseness. In the present specification, with respect to the value of the molybdenum content of the spinel particles, a value measured by the method described in the Examples is employed.

(Incidental Impurities)

The incidental impurities exist in the raw materials or are unavoidably mixed in the spinel particles in the production steps. The incidental impurities mean impurities which are essentially unnecessary but which do not affect the properties of the spinel particles because the amount is very low.

With respect to the incidental impurities, there is no particular limitation, and the incidental impurities are silicon, iron, potassium, sodium, calcium and the like. The incidental impurities may be individually contained, or two or more types thereof may be contained.

The incidental impurity content of the spinel particles based on the mass of the spinel particles is preferably 10,000 ppm or less, more preferably 1,000 ppm or less, further preferably 500 to 10 ppm.

(Other Atoms)

The other atoms mean atoms that are intentionally added to the spinel particles for the purpose of coloring, emitting light or controlling the spinel particle formation or another purpose, in such a manner that the effects of the invention are not impaired.

With respect to the other atoms, there is no particular limitation, and the other atoms are zinc, cobalt, nickel, iron, manganese, titanium, zirconium, calcium, strontium, yttrium and the like. The other atoms may be individually used, or a mixture of two or more types of the other atoms may be used.

The other atom content of the spinel based on the mass of the spinel particles is preferably 10% by mass or less, more preferably 5% by mass or less, further preferably 2% by mass or less.

<Method for Producing the Spinel Particles>

The method for producing the spinel particles includes a firing step in which a magnesium compound and an aluminum compound are subjected to solid solution formation and crystallization in the presence of molybdenum so that spinel particle crystals are grown; and a cooling step in which the spinel particle crystals grown in the firing step are cooled.

[Firing Step]

In the firing step, a magnesium compound and an aluminum compound are subjected to solid solution formation and crystallization in the presence of molybdenum so that spinel particle crystals are grown.

The solid solution formation and the crystallization are generally conducted by a so-called solid phase method. The mechanism of the formation of a solid solution and the crystallization in the solid phase method is speculated as follows. That is, when a magnesium compound and an aluminum compound are heated in an environment in which the compounds are in contact with each other, the magnesium compound and the aluminum compound form nuclei at the boundary (solid phase boundary), and the bond between the solid phases is thus enhanced. The nuclei formed are used as carriers, and solid phase reaction can proceed. At this point, the phenomena that can be used for the solid phase reaction are that the binary phase diagram of the magnesium compound and the aluminum compound is a eutectic system and that the temperature at which the magnesium compound and the aluminum compound can react at the boundary is thus lower than the temperature at which the magnesium compound or the aluminum compound alone melts. Specifically, the magnesium compound and the aluminum compound react at the boundary and form nuclei, and magnesium atoms and/or aluminum atoms diffuse in solid phase through the nuclei and react with the aluminum compound and/or the magnesium compound. As a result, a dense crystal, namely spinel particles can be obtained. During the solid phase diffusion, since the diffusion speed of magnesium atoms into the aluminum compound is relatively higher than the diffusion speed of aluminum atoms into the magnesium compound, spinel particles corresponding to the shape of the aluminum compound tend to be obtained. Thus, by appropriately changing the shape and the average particle diameter of the aluminum compound, the shape and the average particle diameter of the spinel particles can be controlled.

Here, the solid phase reaction described above is conducted in the presence of molybdenum. The effects of molybdenum are not completely clear, but for example, the solid phase reaction is believed to proceed more suitably due to the promotion of the nucleus formation at the boundary, the promotion of the solid phase diffusion of the magnesium atoms and/or the aluminum atoms or another effect. A defect structure or the like is likely to be caused in spinel particles having a plurality of metal components in the firing process, and therefore it is difficult to precisely control the crystal structure. However, when molybdenum is used, the crystal structure of the spinel crystal can be controlled. As a result, the diameter of crystallites of the [111] plane is increased, and spinel particles having excellent thermal conductive properties can be obtained. Moreover, in an embodiment, effects of increasing the diameter of crystallites of the [311] plane and of increasing the ratio of the peak intensity of the [111] plane to the crystalline peak intensity of the [311] plane ([111]/[311]) or another effect can also be obtained. Here, because the solid phase reaction is conducted in the presence of molybdenum, the obtained spinel particles may contain molybdenum.

Conventionally, taking the particle growth into consideration, it has been difficult to obtain spinel particles having high thermal conductivity and having an average particle diameter of 1,000 μm or less, particularly 100 μm or less. For this reason, in a conventional production method, there is a need to first synthesize large spinel particles and then pulverize the large particles into a powdery form. In contrast, in the production method according to this embodiment, spinel particles having high thermal conductivity and having an average particle diameter of 1,000 μm or less, particularly 100 μm or less can be produced.

The properties of the crystal, such as the crystallite diameter of the spinel particle of the [111] plane, the diameter of crystallites of the [311] plane and the ratio of the peak intensity of the [111] plane to the crystalline peak intensity of the [311] plane ([111]/[311]), can be controlled by changing the amount of molybdenum used, the kind of the magnesium compound, the firing temperature, the firing time, the mixing state of the magnesium compound and the aluminum compound. The reason for this is believed to be that the amount of molybdenum, the kind of the magnesium compound, the firing temperature, the firing time and the mixing state of the magnesium compound and the aluminum compound relate to the speeds of the formation of a solid solution of the magnesium compound and the aluminum compound and the crystallization thereof or the like in the solid phase reaction. Use of a highly reactive magnesium compound can increase the speeds of the formation of a solid solution of the magnesium compound and the crystallization thereof, and an increase in the amount of molybdenum used, firing at a high temperature and firing for a long time can increase the speeds of the formation of a solid solution of the magnesium compound and/or the aluminum compound and the crystallization thereof. For example, the diameters of crystallites of the [111] plane and the [311] plane can be thus increased.

(Magnesium Compound)

With respect to the magnesium compound, there is no particular limitation, but examples of magnesium compounds include metallic magnesium; magnesium derivatives, such as magnesium oxide, magnesium hydroxide, magnesium peroxide, magnesium fluoride, magnesium chloride, magnesium bromide, magnesium iodide, magnesium hydride, magnesium diboride, magnesium nitride and magnesium sulfide; magnesium oxo-acid salts, such as magnesium carbonate, calcium magnesium carbonate, magnesium nitrate, magnesium sulfate, magnesium sulfite, magnesium perchlorate, trimagnesium phosphate, magnesium permanganate and magnesium phosphate; magnesium organic salts, such as magnesium acetate, magnesium citrate, magnesium malate, magnesium glutamate, magnesium benzoate, magnesium stearate, magnesium acrylate, magnesium methacrylate, magnesium gluconate, magnesium naphthenate, magnesium salicylate, magnesium lactate and magnesium monoperoxyphthalate; and hydrates thereof. Of these, preferred are magnesium oxide, magnesium hydroxide, magnesium carbonate, magnesium acetate, magnesium nitrate and magnesium sulfate, and more preferred are magnesium oxide, magnesium hydroxide, magnesium nitrate and magnesium acetate. Magnesium hydroxide, magnesium nitrate and magnesium acetate are further preferred because the reactivity is high and because the crystallite diameters of the obtained spinel particles can be increased.

The above-mentioned magnesium compounds may be used individually or in combination.

With respect to the magnesium compound, one which is commercially available may be used, or one which is prepared may be used.

When the magnesium compound is prepared, the reactivity can be adjusted. For example, by neutralizing an aqueous acidic solution of magnesium ions with a base, magnesium hydroxide having a small particle diameter can be obtained. Because the obtained magnesium hydroxide having a small particle diameter is highly reactive, the crystallite diameters of spinel obtained using the magnesium hydroxide tend to be large.

The molar ratio of the aluminum element in the aluminum compound described below to the magnesium element in the magnesium compound (aluminum element/magnesium element) is preferably in the range of from 2.2 to 1.9, more preferably in the range of from 2.1 to 1.8. When the molar ratio is in the range of from 2.2 to 1.9, spinel particles having a large [111] plane crystallite diameter and having high thermal conductivity can be advantageously obtained.

(Aluminum Compound)

With respect to the aluminum compound, there is no particular limitation, but examples of aluminum compounds include aluminum metal, aluminum chloride, aluminum sulfate, aluminum subacetate, aluminum hydroxide, boehmite, pseudoboehmite and aluminum oxide (hydrated aluminum oxide, β-aluminum oxide, γ-aluminum oxide, δ-aluminum oxide, θ-aluminum oxide, α-aluminum oxide and mixed aluminum oxide having two or more kinds of crystal phase).

The above-mentioned aluminum compound is preferably aluminum oxide, preferably aluminum oxide having at least one crystal form selected from the group consisting of α-crystal, β-crystal, γ-crystal, δ-crystal and θ-crystal, more preferably aluminum oxide having α-crystal.

The above-mentioned aluminum compound preferably contains molybdenum. With respect to the state of the molybdenum contained in the molybdenum-containing aluminum compound, there is no particular limitation, and the state is a state in which molybdenum exists on the surface of the aluminum compound in the state of adhering, coating or bonding onto the surface or in another state like that, a state in which molybdenum is incorporated into the aluminum compound or a combination thereof like in the spinel particle. The "state in which molybdenum is incorporated into the aluminum compound" is a state in which at least part of the atoms constituting the aluminum compound is replaced by molybdenum, a state in which molybdenum exists in a space which can be present in the inside of the crystal of the aluminum compound (including a space created by a defect in the crystal structure or the like) or the like. With respect to the atom constituting the aluminum compound to be replaced in the state of replacement, there is no particular limitation, and the atom may be any of an aluminum atom, an oxygen atom and other atoms.

Of the above-mentioned aluminum compounds, an aluminum compound containing molybdenum is preferably used, and an aluminum compound into which molybdenum has been incorporated is more preferably used.

The reason why an aluminum compound containing molybdenum is preferred is not completely clear, but it is speculated that the following mechanism involves. That is, molybdenum contained in the aluminum compound performs the functions of promoting the nucleus formation at the solid phase boundary and promoting the solid phase diffusion of aluminum atoms and magnesium atoms or another function, and the solid phase reaction of the aluminum compound and the magnesium compound is believed to proceed more suitably. This means that, as described below, an aluminum compound containing molybdenum can have the functions of the aluminum compound and molybdenum. In particular, in an aluminum compound into which molybdenum has been incorporated, molybdenum exists directly at the reaction sites or near the reaction sites, and the effects of molybdenum can be exhibited more effectively. In this regard, the mechanism is just a speculated mechanism, and a case in which the desired effects are obtained by a different mechanism is also included in the technical scope.

With respect to the aluminum compound, one which is commercially available may be used, or one which is prepared may be used. When the aluminum compound is prepared, for example, an aluminum compound containing molybdenum can be prepared by a flux method, which is described in detail below. That is, in a preferred embodiment, the method for producing the spinel particles further includes a step of preparing an aluminum compound by a flux method.

Unlike the solid phase method described above, the flux method is classified as a liquid phase method, in particular, a solution method. More specifically, the flux method is a crystal-growing method using the phenomenon that the crystal-flux binary system phase diagram is a eutectic system. The mechanism of the flux method is speculated as follows. That is, when a mixture of a solute and a flux is heated, the solute and the flux turn into a liquid phase. At this point, the flux is a fusing agent, in other words, the solute-flux binary system phase diagram is a eutectic system. Thus, the solute melts at a lower temperature than the melting point and constitutes the liquid phase. When the flux is evaporated in this state, the concentration of the flux decreases, which means that the effect of the flux of decreasing the melting point of the solute is weakened, and the crystal growth of the solute occurs, driven by the evaporation of the flux (flux evaporation method). The solute and the flux can cause the crystal growth of the solute also when the liquid phase is cooled (slow cooling method).

The flux method has, for example, the following advantages: a crystal can be grown at a much lower temperature than the melting point; the crystal structure can be precisely controlled; and a polyhedral crystal having a specific crystal plane can be formed.

In the case where the aluminum compound is prepared by the flux method, an aluminum compound containing molybdenum can be obtained through aluminum molybdate which is an intermediate when a molybdenum compound is used as the fluxing agent. Here, the molybdenum contained in the aluminum compound may be flux impurities, which are considered as a disadvantage of the flux method. However, as described above, in an embodiment of the invention, the molybdenum contained in the aluminum compound can exhibit a preferable effect when spinel particles are produced.

In an embodiment, the flux method includes a flux evaporation step for firing a mixture containing an aluminum source and a molybdenum compound and a cooling step for cooling the aluminum compound which has crystal-grown in the firing step (flux evaporation method).

Aluminum Source

With respect to the aluminum source, there is no particular limitation, but examples of aluminum sources include aluminum chloride, aluminum sulfate, aluminum subacetate, aluminum hydroxide, boehmite, pseudoboehmite, transitional alumina ($\gamma$-alumina, $\delta$-alumina, $\theta$-alumina or the like), hydrated alumina, $\alpha$-alumina and a mixed alumina having two or more kinds of crystal phase. Of these, aluminum hydroxide, transitional alumina, boehmite, pseudoboehmite and hydrated alumina are preferred, and aluminum hydroxide, transitional alumina and boehmite are more preferred.

The above-mentioned aluminum sources may be used individually or in combination.

With respect to the aluminum source, one which is commercially available may be used, or one which is prepared may be used.

When the aluminum source is prepared, for example, hydrated alumina or transitional alumina which is structurally highly stable at a high temperature can be prepared by neutralization of an aqueous aluminum solution. More specifically, the hydrated alumina can be prepared by neutralizing an aqueous acidic solution of aluminum with a base, and the transitional alumina can be prepared by heat-treating the obtained hydrated alumina. Thus-obtained hydrated alumina or transitional alumina is structurally highly stable at a high temperature, and thus a molybdenum-containing aluminum compound having a large average particle diameter tends to be obtained when the alumina is fired in the presence of molybdenum.

With respect to the shape of the aluminum source, there is no particular limitation, and any of a spherical shape, an indefinite shape, a structure having an aspect (wires, fibers, ribbons, tubes and the like), a sheet and the like can be suitably used.

With respect also to the average particle diameter of the aluminum source, there is no particular limitation, and 5 nm to 10,000 μm is preferred.

The aluminum source may form a complex with an organic compound. Examples of the complex include an organic-inorganic complex obtained by modifying an aluminum compound using an organic silane, a polymer-adsorbed aluminum compound complex and a complex coated with an organic compound. With respect to the organic compound content in the case of using such a complex, there is no particular limitation, and the content is preferably 60% by mass or less, more preferably 30% by mass or less.

Molybdenum Compound

With respect to the molybdenum compound, there is no particular limitation, but examples of molybdenum compounds include metallic molybdenum, molybdenum oxide, molybdenum sulfide, sodium molybdate, potassium molybdate, calcium molybdate, ammonium molybdate, $H_3PMo_{12}O_{40}$ and $H_3SiMo_{12}O_{40}$. In this case, the molybdenum compounds include isomers thereof. For example, the molybdenum oxide may be molybdenum(IV) dioxide ($MoO_2$) or molybdenum(VI) trioxide ($MoO_3$). Of these, preferred are molybdenum trioxide, molybdenum dioxide and ammonium molybdate, and more preferred is molybdenum trioxide.

The above-mentioned molybdenum compounds may be used individually or in combination.

The molar ratio of the molybdenum element of the molybdenum compound to the aluminum element of the aluminum compound (molybdenum element/aluminum element) is preferably 0.01 to 3.0, more preferably 0.03 to 1.0. When the molar ratio is 0.01 or more, the crystal growth of the aluminum compound containing molybdenum can advantageously proceed suitably. On the other hand, when the molar ratio is 3.0 or less, the industrial preparation of the aluminum compound containing molybdenum can be advantageously conducted efficiently.

Firing

When a mixture containing the aluminum source and the molybdenum compound is fired, through aluminum molybdate which is an intermediate, the aluminum molybdate is decomposed, and the molybdenum compound is evaporated, resulting in the formation of an aluminum compound containing molybdenum. Here, the crystal growth of the aluminum compound containing molybdenum is driven by the evaporation of the molybdenum compound.

With respect to the firing temperature, there is no particular limitation, but the firing temperature is preferably 700° C. to 2,000° C., more preferably 900 to 1,600° C., further preferably 950 to 1,500° C., especially preferably 1,000 to 1,400° C. When the firing temperature is 700° C. or higher, the flux reaction advantageously proceeds preferably. On the other hand, when the firing temperature is 2,000° C. or lower, the burden to the firing furnace or the cost for the fuel can be advantageously reduced.

With respect to the state of the aluminum source and the molybdenum compound for the firing, there is no particular limitation as long as the molybdenum compound and the aluminum source exist in a same space. For example, the flux reaction can proceed even when the two are not mixed. When the molybdenum compound and the aluminum source are mixed, they can be mixed, for example, by simply mixing powders, mechanical mixing using a pulverizer or the like or mixing using a mortar or the like, and the obtained mixture may be in a dry state or in a wet state.

With respect also to the firing time, there is no particular limitation, but the firing time is preferably 5 minutes to 30 hours, and from the viewpoint of the efficient formation of the aluminum compound containing molybdenum, the firing time is more preferably 10 minutes to 15 hours.

With respect also to the firing atmosphere, there is no particular limitation, but for example, the firing atmosphere is preferably an oxygen-containing atmosphere such as air or oxygen or an inert atmosphere such as nitrogen or argon, more preferably an oxygen-containing atmosphere or a nitrogen atmosphere, which are not corrosive, from the viewpoint of the safety of the operator or the durability of the furnace, further preferably an air atmosphere from the viewpoint of the cost.

With respect also to the firing apparatus, there is no particular limitation, and a so-called firing furnace is generally used. The firing furnace is preferably composed of a material which does not react with the sublimated molybdenum compound and is more preferably a tightly-closed firing furnace with which the molybdenum compound can be used efficiently.

Cooling

The cooling step is a step of cooling the aluminum compound which has crystal-grown in the firing step.

With respect to the cooling rate, there is no particular limitation, but the cooling rate is preferably 1 to 1,000° C./hour, more preferably 5 to 500° C./hour, further preferably 50 to 100° C./hour. When the cooling rate is 1° C./hour or more, the production time can be advantageously reduced. On the other hand, when the cooling rate is 1,000° C./hour or less, the container for firing is unlikely to be broken due to thermal shock and can be advantageously used for a long term.

With respect to the cooling method, there is no particular limitation, and natural cooling may be performed, or a cooling apparatus may be used.

Molybdenum-Containing Aluminum Compound

The aluminum compound obtained by the flux method generally has a color because molybdenum is contained. Although the color varies also with the amount of molybdenum contained, the color is generally light blue to dark blue close to black, and the color tends to be darker in proportion to the molybdenum content. Depending on the composition, the aluminum compound containing molybdenum sometimes has another color. For example, the compound containing molybdenum can be red when the compound contains chromium, and the compound can be yellow when nickel is contained.

With respect to the molybdenum content of the aluminum compound containing molybdenum, there is no particular limitation, but the molybdenum content in terms of molybdenum trioxide is preferably 0.001 to 10% by mass or less, more preferably 0.001 to 8% by mass, further preferably 0.01 to 5% by mass. When the molybdenum content is 0.001% by mass or more the crystal growth of the spinel can advantageously proceed more efficiently. On the other hand, when the molybdenum content is 10% by mass or less, the crystal quality of the aluminum compound can be advantageously improved. In the present specification, with respect to the value of the molybdenum content of the aluminum compound, a value measured by the method described in the Examples is employed.

The aluminum compound containing molybdenum preferably has a high α-crystallinity degree with a crystal plane other than the [001] plane serving as the main crystal plane, where the molybdenum compound functions as a fluxing agent, and the α-crystallinity degree is more preferably 90% or more.

The proportion of the maximum flat area of the aluminum compound containing molybdenum is preferably one eighth of the total surface area or less, more preferably one sixteenth or less.

In an embodiment, the flux method includes a step of firing a mixture containing the aluminum source and the molybdenum compound and a slow cooling step for cooling the obtained fired material for crystal growth (slow cooling method).

With respect to the average particle diameter of the aluminum compound, there is no particular limitation, but the average particle diameter is preferably 0.1 to 1,000 μm, more preferably 0.5 μ to 500 μm, further preferably 1 to 100 μm. When the average particle diameter of the aluminum compound is 0.1 μm or more, the particle agglomeration can be advantageously prevented during the crystallization of the spinel. On the other hand, when the average particle diameter of the aluminum compound is 1,000 μm or less, the crystallization of the spinel can advantageously proceed efficiently into the centers of the particles.

With respect also to the specific surface area of the aluminum compound, there is no particular limitation, but the specific surface area is preferably 0.0001 to 500 m²/g or less, more preferably 0.0001 to 250 m²/g, further preferably 0.001 to 50 m²/g. When the specific surface area of the aluminum compound is 0.0001 m²/g or more, the crystallization of the spinel can advantageously proceed efficiently into the centers of the particles. On the other hand, when the specific surface area of the aluminum compound is 500 m²/g or less, the shape of the spinel particles can be advantageously controlled.

With respect also to the shape of the aluminum compound, there is no particular limitation, and examples include a polyhedral shape, a spherical shape, an ellipsoidal shape, a cylindrical shape, a polygonal prism shape, a needle-like shape, a rod shape, a plate form, a disk form, a flake form and a scale form. Of these, from the viewpoint of facilitating dispersion of the obtained spinel particles in a resin, preferred are a polyhedral shape, a spherical shape, an ellipsoidal shape and a plate form, and more preferred are a polyhedral shape and a spherical shape.

(Molybdenum)

Molybdenum has the functions of promoting the nucleus formation at the boundary and promoting the solid phase diffusion of magnesium atoms and/or aluminum atoms or another function in the solid phase reaction.

As the molybdenum, molybdenum metal and molybdenum in a compound containing molybdenum can be used. Specific examples of the compound containing molybdenum include the molybdenum compounds and the aluminum compounds containing molybdenum described above. In this regard, the aluminum compounds containing molybdenum can be used as the compound containing molybdenum and the aluminum compound. The above-mentioned molybdenum kinds may be used individually or in combination.

With respect to the amount of molybdenum used, the molar ratio of the molybdenum element to the aluminum element of the aluminum compound (molybdenum element/aluminum element) is preferably 0.00001 to 0.05, more preferably 0.0001 to 0.03. When the molar ratio is in the range of from 0.00001 to 0.05, the formation of a solid solution of the magnesium compound and the aluminum compound and the crystallization of the spinel can advantageously proceed suitably.

(Firing)

The firing is conducted in the presence of molybdenum in the state in which the magnesium compound and the aluminum compound are mixed. With respect to the mixing state of the magnesium compound and the aluminum compound, there is no particular limitation. When the two are mixed, they are mixed for example, by simply mixing powders, mechanical mixing using a pulverizer, a mixer or the like or mixing using a mortar or the like. The obtained mixture may be in a dry state or in a wet state, but the mixture is preferably in a dry state from the viewpoint of the cost.

With respect to the firing temperature, there is no particular limitation, but the firing temperature is preferably 800 to 2,000° C., more preferably 1,000 to 1,600° C. When the firing temperature is 800° C. or higher, spinel particles having a large [111] plane crystallite diameter can be advantageously obtained in a short time. On the other hand, when the firing temperature is 2,000° C. or lower, necking of the formed spinel particles is prevented, and the shape and/or the dispersibility of the spinel particles are advantageously controlled easily.

With respect to the firing time, there is no particular limitation, but the firing time is preferably 0.1 to 1,000 hours, more preferably 3 to 100 hours. When the firing time is 0.1 hours or more, spinel particles having a large [111] plane crystallite diameter can be advantageously obtained. On the other hand, when the firing time is 1,000 hours or less, the production cost can be advantageously reduced.

During the firing, an additive can also be used to promote the formation of a solid solution of the magnesium compound and the aluminum compound and the crystallization thereof. Examples of the additive include a metal compound and a chloride. The amount of the additive is preferably 0.01 to 20% by mass, more preferably 0.1 to 10% by mass.

The firing atmosphere may be an air atmosphere, an atmosphere of an inert gas, such as nitrogen gas or argon gas, an oxygen atmosphere, an ammonia gas atmosphere or a carbon dioxide atmosphere. In this case, from the viewpoint of the production cost, an air atmosphere is preferred.

With respect also to the pressure for the firing, there is no particular limitation, and the firing may be conducted under atmospheric pressure, under a pressure or under a reduced pressure, but the firing is preferably conducted under a reduced pressure because the vapor of molybdenum oxide generated during the firing can be discharged from the firing furnace efficiently.

With respect to the heating means, there is no particular limitation, but a firing furnace is preferably used. Examples of usable firing furnaces include a tunnel kiln, a roller hearth kiln, a rotary kiln and a muffle furnace.

The firing furnace is preferably composed of a material which does not react with vapor of molybdenum oxide, and a tightly-closed firing furnace is more preferably used.

[Cooling Step]

The cooling step is a step of cooling spinel particles which have crystal-grown in the firing step.

With respect also to the cooling rate, there is no particular limitation, but the cooling rate is preferably 1 to 1,000° C./hour, more preferably 5 to 500° C./hour, further preferably 50 to 100° C./hour. When the cooling rate is 1° C./hour or more, the production time can be advantageously reduced. On the other hand, when the cooling rate is 1,000° C./hour or less, the container for firing is unlikely to be broken due to thermal shock and can be advantageously used for a long term.

With respect to the cooling method, there is no particular limitation, and natural cooling may be performed, or a cooling apparatus may be used.

<Composition>

In an embodiment of the invention, there is provided a composition including the spinel particles and a resin. If necessary, the composition may further include a curing agent, a curing catalyst, a viscosity modifier, a plasticizer or the like.

(Spinel Particles)

With respect to the spinel particles, those described above can be used, and therefore description of them is omitted.

The spinel particles which have been subjected to surface treatment can be used.

A single type of the spinel particles may be used individually, or two or more types of the spinel particles may be used in combination.

The spinel particles and another filler (aluminum oxide, boron nitride, aluminum nitride, magnesium oxide or magnesium carbonate) may be used in combination.

The spinel particle content of the composition based on the mass of the composition is preferably 10 to 95% by mass, more preferably 30 to 90% by mass. When the spinel particle content is 10% by mass or more, the spinel particles can advantageously efficiently exhibit high thermal conductivity. On the other hand, when the spinel particle content is 95% by mass or less, a resin composition having excellent moldability can be advantageously obtained.

(Resin)

With respect to the resin, there is no particular limitation, and examples of resins include thermoplastic resins and thermosetting resins.

With respect to the thermoplastic resin, there is no particular limitation, and there can be used a resin which is known and commonly used in molding materials and the like. Specific examples of thermoplastic resins include polyethylene resins, polypropylene resins, polymethyl methacrylate resins, polyvinyl acetate resins, ethylene-propylene copolymers, ethylene-vinyl acetate copolymers, polyvinyl chloride resins, polystyrene resins, polyacrylonitrile resins, polyamide resins, polycarbonate resins, polyacetal resins, polyethylene terephthalate resins, polyphenylene oxide resins, polyphenylene sulfide resins, polysulfone resins, polyether sulfone resins, polyether ether ketone resins, polyallyl sulfone resins, thermoplastic polyimide resins, thermoplastic urethane resins, polyaminobismaleimide resins, polyamide-imide resins, polyether imide resins, bismaleimide triazine resins, polymethylpentene resins, fluorinated resins, liquid crystal polymers, olefin-vinyl alcohol copolymers, ionomer resins, polyarylate resins, acrylonitrile-ethylene-styrene copolymers, acrylonitrile-butadiene-styrene copolymers and acrylonitrile-styrene copolymers.

The thermosetting resin is a resin having properties such that it can be changed to be substantially insoluble or infusible upon being cured by a method, such as heating, radiation or a catalyst, and, generally, there can be used a resin which is known and commonly used in molding materials and the like. Specific examples of thermosetting resins include novolak phenolic resins, such as a phenolic novolak resin and a cresol novolak resin; phenolic resins, such as resol phenolic resins, e.g., an unmodified resol phenolic resin and an oil-modified resol phenolic resin modified with tung oil, linseed oil, walnut oil or the like; bisphenol epoxy resins, such as a bisphenol A epoxy resin and a bisphenol F epoxy resin; novolak epoxy resins, such as an aliphatic chain-modified bisphenol epoxy resin, a novolak epoxy resin and a cresol novolak epoxy resin; epoxy resins, such as a biphenyl epoxy resin and a polyalkylene glycol epoxy resin; resins having a triazine ring, such as an urea resin and a melamine resin; vinyl resins, such as (a)an (meth)acrylic resin and a vinyl ester resin; unsaturated polyester resins, bismaleimide resins, polyurethane resins, diallyl phthalate resins, silicone resins, resins having a benzoxazine ring and cyanate ester resins.

The above-mentioned resins may be used individually or in combination. In this case, two or more types of thermoplastic resins may be used, two or more types of thermosetting resins may be used, or one or more types of thermoplastic resins and one or more types of thermosetting resins may be used.

The resin content of the composition based on the mass of the composition is preferably 5 to 90% by mass, more preferably 10 to 70% by mass. When the resin content is 5% by mass or more, excellent moldability can be advantageously imparted to the resin composition. On the other hand, when the resin content is 90% by mass or less, a molded compound having high thermal conductivity can be advantageously obtained.

(Curing Agent)

With respect to the curing agent, there is no particular limitation, and a known curing agent can be used.

Specific examples of curing agents include amine compounds, amide compounds, acid anhydride compounds and phenolic compounds.

Examples of the amine compounds include diaminodiphenylmethane, diethylenetriamine, triethylenetetramine, diaminodiphenyl sulfone, isophorone diamine, imidazole, a $BF_3$-amine complex and guanidine derivatives.

Examples of the amide compounds include dicyandiamide and a polyamide resin synthesized from a dimer of linolenic acid and ethylenediamine.

Examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride and methylhexahydrophthalic anhydride.

Examples of the phenolic compounds include polyhydric phenolic novolak resins synthesized from a polyhydric hydroxy compound and formaldehyde, such as a phenolic novolak resin, a cresol novolak resin, an aromatic hydrocarbon formaldehyde resin-modified phenolic resin, a dicyclopentadiene phenol addition-type resin, a phenolic aralkyl resin (Xylok resin) and a resorcin novolak resin and polyhydric phenolic compounds, such as a naphtholaralkyl resin, a trimethylolmethane resin, a tetraphenylolethane resin, a naphthol novolak resin, a naphthol-phenol cocondensed novolak resin, a naphthol-cresol cocondensed novolak resin, a biphenyl-modified phenolic resin (a polyhydric phenolic compound having a phenol nucleus connected through a bismethylene group), a biphenyl-modified naphthol resin (a polyhydric naphthol compound having a phenol nucleus connected through a bismethylene group), an aminotriazine-modified phenolic resin (a polyhydric phenolic compound having a phenol nucleus connected through melamine, benzoguanamine or the like) and an alkoxy group-containing aromatic ring-modified novolak resin (a polyhydric phenolic compound having a phenol nucleus and an alkoxy group-containing aromatic ring connected through formaldehyde).

The above-mentioned curing agents may be used individually or in combination.

(Curing Accelerator)

The curing accelerator has a function of accelerating curing of the composition being cured.

With respect to the curing accelerator, there is no particular limitation, but examples of curing accelerators include phosphorus compounds, tertiary amines, imidazoles, organic acid metal salts, Lewis acids and amine complex salts.

The above-mentioned curing accelerators may be used individually or in combination.

(Curing Catalyst)

The curing catalyst has a function of causing a compound having an epoxy group to undergo a curing reaction as a substitute for the curing agent.

With respect to the curing catalyst, there is no particular limitation, and there can be used a heat polymerization initiator or active energy ray polymerization initiator which is known and commonly used.

The curing catalysts may be used individually or in combination.

(Viscosity Modifier)

The viscosity modifier has a function of modifying the viscosity of the composition.

With respect to the viscosity modifier, there is no particular limitation, and an organic polymer, polymer particles, inorganic particles or the like can be used.

The viscosity modifiers may be used individually or in combination.

(Plasticizer)

The plasticizer has a function of improving a thermoplastic synthetic resin in processability, flexibility or weathering resistance.

With respect to the plasticizer, there is no particular limitation, and a phthalate, an adipate, a phosphate, a trimellitate, a polyester, a polyolefin, a polysiloxane or the like can be used.

The above-mentioned plasticizers may be used individually or in combination.

(Applications)

According to an embodiment of the invention, the composition of the present embodiment is used in a thermally conductive material.

As mentioned above, alumina has been generally used as a thermally conductive material from the viewpoint of the cost, and further boron nitride, aluminum nitride, magnesium oxide, magnesium carbonate and the like have been used. In this connection, spinel particles have been known to be poorer in thermal conductive properties than alumina, and therefore there has not been an idea that spinel particles are used instead of alumina.

In contrast, the spinel particles of the present embodiment have a large [111] plane crystallite diameter and hence have excellent thermal conductive properties. Particularly, the thermal conductivity of the spinel particles is higher than the thermal conductivity of alumina. Therefore, the composition of the present embodiment is preferably used in a thermally conductive material.

In an embodiment, the spinel particles obtained by the above-described production method have a particle diameter on the order of micron (1,000 μm or less) and a large crystallite diameter, therefore have excellent dispersibility in a resin and hence can exhibit more excellent thermal conductive properties in the form of a composition.

Further, in another embodiment, the spinel particles obtained by the above-described production method are particles of a polyhedral shape having a specific crystal plane synthesized by a solid phase method and are not obtained by pulverizing particles of an indefinite shape, and hence the spinel particles have excellent smoothness and excellent dispersibility in a resin. Therefore, the spinel particles can exhibit very high thermal conductive properties in the form of a composition.

In addition, the spinel particles can be used in applications, such as gems, catalyst carriers, adsorbents, photocatalysts, optical materials, heat-resistant insulating materials, substrates and sensors.

<Molded Article>

In an embodiment of the invention, there is provided a molded article which is obtained by molding the above-described composition.

The spinel particles contained in the molded article have excellent thermal conductive properties, and therefore the molded article is preferably used as an insulating heat dissipation member. Thus, the molded article can improve electric devices in the heat dissipation function and can contribute to the reduction in size and weight and the improvement of performance of the electric devices.

Further, the molded article according to another embodiment of the invention can be used in low-dielectric constant members and the like. The spinel particles in the molded article have a low dielectric constant and therefore can contribute to the improvement of communication function in high-frequency circuits.

EXAMPLES

Hereinbelow, the present invention will be described in more detail with reference to the following Examples, which should not be construed as limiting the scope of the invention.

Synthesis Example 1

A molybdenum-containing α-aluminum oxide was synthesized by a flux evaporation method.

In a mortar, 40 g of aluminum oxide (manufactured by Wako Pure Chemical Industries, Ltd., activated alumina (average particle diameter of 45 μm) and 10 g of molybdenum trioxide (manufactured by Wako Pure Chemical Industries, Ltd.) were mixed. The obtained mixture was put into a crucible and fired at 1,100° C. for 10 hours using an AMF-2P-Model temperature controller-equipped ceramic electric furnace, firing furnace Model ARF-100K (ceramic electric furnace, manufactured by ASH). After allowing to cool to room temperature, the crucible was taken out, and the contents were washed with 10% aqueous ammonia and deionized water. At the end, after drying at 150° C. for 2 hours, a blue powder of a molybdenum-containing α-aluminum oxide was obtained.

(Evaluation)

The obtained molybdenum-containing α-aluminum oxide was evaluated as follows.

<Crystal Structure>

The crystal structure of the molybdenum-containing α-aluminum oxide powder was analyzed by X-ray diffractometry (XRD) using CuKα as the radiation source.

Specifically, using Rint-TT II (manufactured by Rigaku Corporation) which is a wide-angle X-ray diffraction apparatus, an analysis was conducted. In this instance, a 2θ/θ method was used as a measurement method. Measuring conditions are such that the scanning speed is 2.0 degrees/minute, the scanning range is 5 to 70 degrees, and the step is 0.02 degrees.

As a result, the powder sample had a sharp scattering peak derived from α-crystalline aluminum oxide, and crystalline peaks other than that of α-crystal structure were not observed.

The X-ray diffraction pattern is shown in FIG. 1.

<Particle Shape and Average Particle Diameter>

The particle shape of the molybdenum-containing α-aluminum oxide was observed using a scanning electron microscope (SEM), and the average particle diameter was measured.

Here, VE-9800 (manufactured by Keyence Corporation) which is a surface examination apparatus was used for the observation and the measurement.

With respect to the particle shape, the molybdenum-containing α-aluminum oxide had a shape close to a spherical shape. Moreover, it was observed that a crystal plane other than the [001] plane was the main crystal plane and that the particles were polyhedral particles having eight faces or more having a crystal plane with a larger area than that of the [001] plane.

With respect to the average particle diameter, particle diameters of 100 random particles were measured from an image obtained using a scanning electron microscope (SEM), and the average calculated was 5 μm.

A SEM image of the molybdenum-containing α-aluminum oxide particles is shown in FIG. 2.

<Molybdenum Content>

With respect to the molybdenum-containing α-aluminum oxide, the molybdenum content was measured by X-ray Fluorescence Analysis (XRF).

Specifically, measurement was made using ZSX100e (manufactured by Rigaku Corporation) which is a fluorescent X-ray analyzer. In this instance, an FP (function point) method was used as a measurement method. Measuring conditions are such that EZ scanning is used, the measuring range is B to U, the measured diameter is 10 mm, and the sample weight is 50 mg. The measurement was performed with respect to the sample as in the form of a powder, and, in this instance, a polypropylene (PP) film was used for preventing the powder from scattering.

As a result, the molybdenum content of the molybdenum-containing α-aluminum oxide after washing was 1.0% by mass in terms of molybdenum trioxide.

The molybdenum content of the molybdenum-containing α-aluminum oxide before washing with aqueous ammonia was measured and was 3.5% by mass.

<Measurement of Specific Surface Area>

With respect to the molybdenum-containing α-aluminum oxide powder, a BET specific surface area was measured.

Specifically, measurement was made using an apparatus Model Tris 3000 (manufactured by Micromeritics Instrument Company). In this instance, a nitrogen gas adsorption/desorption method was used as a measurement method.

As a result, the specific surface area of the molybdenum-containing α-aluminum oxide was 0.37 m$^2$/g.

Synthesis Example 2

A molybdenum-containing α-aluminum oxide was synthesized by a flux evaporation method.

A blue powder of a molybdenum-containing α-aluminum oxide in an amount of 48.5 g was obtained by the same method as that of Synthesis Example 1 except that 50 g of γ-alumina (manufactured by STREM CHEMICALS, average particle diameter of 40 to 70 μm) and 50 g of molybdenum trioxide (manufactured by Wako Pure Chemical Industries, Ltd.) were used.

(Evaluation)

The average particle diameter, the molybdenum content and the specific surface area were measured by the same methods as those of Synthesis Example 1. As a result, the average particle diameter was 20 μm, and the molybdenum content was 1.3% by mass in terms of molybdenum trioxide. The specific surface area was 0.01 m$^2$/g.

A SEM image of the molybdenum-containing α-aluminum oxide is shown in FIG. 3.

Example 1

In a mortar, 1.00 g of the molybdenum-containing α-aluminum oxide synthesized in Synthesis Example 1 (aluminum element: 0.02 mol and molybdenum element: 0.07 mmol) and 0.40 g of magnesium oxide (manufactured by Wako Pure Chemical Industries, Ltd.) (magnesium element: 0.01 mol) were dry mixed. The obtained mixture was put into an alumina crucible and heated to 1,500° C. in an air atmosphere at a temperature increase rate of 10° C./minute.

After 12 hours, the mixture was allowed to stand to be naturally cooled to room temperature, and spinel particles were thus produced.

(Evaluation)

The produced spinel particles were evaluated as follows.

<Analysis of Crystal Structure>

With respect to the spinel particles, the crystal structure was analyzed by X-ray diffractometry (XRD) by the same method as that of Synthesis Example 1.

As a result, the spinel particles were found to be a spinel crystal of a cubic crystal system having a composition: $MgAl_2O_4$ and highly crystalline properties.

The X-ray diffraction pattern is shown in FIG. 4.

<Particle Shape and Average Particle Diameter>

By the same methods as those of Synthesis Example 1, the particle shape of the spinel particles was observed using a scanning electron microscope (SEM), and the average particle diameter was measured.

With respect to the particle shape, the spinel particles had a shape corresponding to the shape of the molybdenum-containing OG-aluminum oxide used.

The average particle diameter was 5 μm.

A SEM image of the spinel particles is shown in FIG. 5.

<Molybdenum Content>

With respect to the spinel particles, the molybdenum content was measured by X-ray Fluorescence Analysis (XRF) by the same method as that of Synthesis Example 1.

As a result, the molybdenum content of the spinel particles was 0.3% by mass in terms of molybdenum trioxide.

<Measurement of Specific Surface Area>

With respect to the spinel particles, a BET specific surface area was measured by the same method as that of Synthesis Example 1

As a result, the specific surface area of the spinel particles was 0.4 m$^2$/g.

<Measurement of Crystallite Diameters>

With respect to the produced spinel particles, the diameters of the crystallites of the [111] plane and the [311] plane were measured.

Specifically, measurement was made using SmartLab (manufactured by Rigaku Corporation) which is an X-ray diffraction apparatus, using a high-intensity high-resolution crystal analyzer (CALSA) (manufactured by Rigaku Corporation) as a detector. The analysis was made using PDXL as an analysis soft. In this instance, the measurement method was powder X-ray diffractometry, and the analysis was made using the CALSA function of PDXL. The diameter of crystallites of the [111] plane was calculated using the Sherrer's equation from a full width at half maximum of a peak appearing around $2\theta=19°$, and the diameter of crystallites of the [311] plane was calculated using the Sherrer's equation from a full width at half maximum of a peak appearing around $2\theta=37°$. Measuring conditions are such that the method is a $2\theta/\theta$ method, the tube voltage is 45 kV, the tube current is 200 mA, the scanning speed is 0.05 degree/minute, the scanning range is 10 to 70 degrees, the step is 0.002 degrees, and βs=20 rpm. The apparatus standard width used was 0.026°, which was calculated using standard silicon powder produced by National Institute of Standards and Technology (NIST, 640d).

As a result, the crystallite diameter of the spinel particles of the [111] plane was 251 nm, and the crystallite diameter of the [311] plane was 281 nm.

<Ratio of Crystalline Peak Intensity of [111] Plane of Spinel to Crystalline Peak Intensity of [311] Plane ([111]/[311])>

The ratio [111]/[311] was calculated using the powder X-ray diffraction pattern obtained using CuKα as the radiation source in the analysis of the crystal structure.

The diffraction peak ascribed to the [111] plane is the maximum peak appearing around 2θ=19°, and the diffraction peak ascribed to the [311] plane is the maximum peak appearing around 2θ=37°. Here, it is intended that around 2θ=19° or 2θ=37° means the range of 2θ=19°±0.5° or 2θ=37°±0.5°.

As a result, the ratio [111]/[311] of the spinel particles was 0.363.

Example 2

Spinel particles were produced by the same method as that of Example 1 except that the molybdenum-containing α-aluminum oxide synthesized in Synthesis Example 2 (aluminum element: 0.02 mol and molybdenum element: 0.07 mmol) was used.
(Evaluation)
By the same methods as those of Example 1, the average particle diameter, the molybdenum content, the specific surface area, the diameters of crystallites of the [111] plane and the [311] plane and the crystalline peak intensity ratio ([111]/[311]) were measured. As a result, the average particle diameter was 20 μm, and the molybdenum content was 0.30% by mass in terms of molybdenum trioxide. The specific surface area was 0.02 m$^2$/g. The diameter of crystallites of the [111] plane was 263 nm, and the diameter of crystallites of the [311] plane was 184 nm. The crystalline peak intensity ratio ([111]/[311]) was 0.371.

A SEM image of the obtained spinel particles is shown in FIG. 6.

Example 3

Spinel particles were produced by the same method as that of Example 1 except that the molybdenum-containing α-aluminum oxide synthesized in Synthesis Example 1 before washing with aqueous ammonia (molybdenum content in terms of molybdenum oxide: 3.5% by mass) was used.
(Evaluation)
By the same methods as those of Example 1, the average particle diameter, the molybdenum content, the specific surface area, the diameters of crystallites of the [111] plane and the [311] plane and the crystalline peak intensity ratio ([111]/[311]) were measured. As a result, the average particle diameter was 5 μm, and the molybdenum content was 0.40% by mass in terms of molybdenum trioxide. The specific surface area was 0.4 m$^2$/g. The diameter of crystallites of the [111] plane was 364 nm, and the diameter of crystallites of the [311] plane was 645 nm. The crystalline peak intensity ratio ([111]/[311]) was 0.349.

Example 4

Spinel particles were produced by the same method as that of Example 1 except that 0.58 g of magnesium hydroxide (magnesium element: 0.01 mol) was used instead of magnesium oxide
(Evaluation)
By the same methods as those of Example 1, the average particle diameter, the molybdenum content, the specific surface area, the diameters of crystallites of the [111] plane and the [311] plane and the crystalline peak intensity ratio ([111]/[311]) were measured. As a result, the average particle diameter was 5 μm, and the molybdenum content was 0.30% by mass in terms of molybdenum trioxide. The specific surface area was 0.4 m$^2$/g. The diameter of crystallites of the [111] plane was 410 nm, and the diameter of crystallites of the [311] plane was 530 nm. The crystalline peak intensity ratio ([111]/[311]) was 0.330.

Comparative Example 1

Spinel particles were produced by the same method as that of Example 1 except that the molybdenum-containing α-aluminum oxide was replaced with α-crystalline aluminum oxide A18 (aluminum element: 0.02 mol, average particle diameter: 18 μm, manufactured by Sumitomo Chemical Co., Ltd.).
(Evaluation)
The crystal structure was analyzed by the same method as that of Example 1. As a result, the spinel particles were found to be a spinel crystal having a composition: MgAl$_2$O$_4$ but having low crystallinity.

In addition, the molybdenum content was measured by the same method as that of Example 2. As a result, molybdenum was not detected.

Furthermore, by the same methods as those of Example 1, the average particle diameter, the specific surface area, the diameters of crystallites of the [111] plane and the [311] plane and the crystalline peak intensity ratio ([111]/[311]) were measured. As a result, the average particle diameter was 18 μm, and the specific surface area was 0.05 m$^2$/g. The diameter of crystallites of the [111] plane was 216 nm, and the diameter of crystallites of the [311] plane was 181 nm. The crystalline peak intensity ratio ([111]/[311]) was 0.336.

Comparative Example 2

Spinel particles were produced by the same method as that of Example 1 except that the molybdenum-containing α-aluminum oxide was replaced with aluminum oxide DAW45 (α/θ-aluminum oxide, aluminum element: 0.02 mol, average particle diameter: 45 μm, manufactured by Denki Kagaku Kogyo Kabushiki Kaisha).
(Evaluation)
The crystal structure was analyzed by the same method as that of Example 1. As a result, the spinel particles were found to be a spinel crystal having a composition: MgAl$_2$O$_4$ but having low crystallinity.

In addition, the molybdenum content was measured by the same method as that of Example 1. As a result, molybdenum was not detected.

Furthermore, by the same methods as those of Example 1, the average particle diameter, the specific surface area, the diameters of crystallites of the [111] plane and the [311] plane and the crystalline peak intensity ratio ([111]/[311]) were measured. As a result, the average particle diameter was 45 μm, and the specific surface area was 0.05 m$^2$/g. The diameter of crystallites of the [111] plane was 179 nm, and the diameter of crystallites of the [311] plane could not be analyzed because a shoulder peak was mixed. The crystalline peak intensity ratio ([111]/[311]) was 0.360.

Comparative Example 3

Commercially available spinel particles (a 325-mesh passed product, manufactured by Alfa Aesar) were prepared.
(Evaluation)
The crystal structure was analyzed by the same method as that of Example 1. As a result, the spinel particles were found to be a spinel crystal having a composition: $MgAl_2O_4$ but having low crystallinity. The shape was indefinite.

In addition, the molybdenum content was measured by the same method as that of Example 1. As a result, molybdenum was not detected.

Furthermore, by the same methods as those of Example 1, the particle diameter, the specific surface area, the diameters of crystallites of the [111] plane and the [311] plane and the crystalline peak intensity ratio ([111]/[311]) were measured. As a result, the particle diameter distribution was broad with the particle diameter of 45 μm or less, and the specific surface area was 1.25 m²/g. The diameter of crystallites of the [111] plane was 159 nm, and the diameter of crystallites of the [311] plane was 174 nm. The crystalline peak intensity ratio ([111]/[311]) was 0.286.

The formulations for the raw materials in Examples 1 to 4 and Comparative Examples 1 and 2 are shown in Table 1 below.

TABLE 1

|  | Aluminum compound | | | | Magnesium compound | |
| --- | --- | --- | --- | --- | --- | --- |
|  | Type | Amount (g) | Average particle diameter (μm) | Molybdenum content (%) | Type | Amount (g) |
| Example 1 | Molybdenum-containing α-aluminum oxide | 1.00 | 5 | 1.0 | Magnesium oxide | 0.40 |
| Example 2 | Molybdenum-containing α-aluminum oxide | 1.00 | 20 | 1.3 | Magnesium oxide | 0.40 |
| Example 3 | Molybdenum-containing α-aluminum oxide | 1.00 | 5 | 3.5 | Magnesium oxide | 0.40 |
| Example 4 | Molybdenum-containing α-aluminum oxide | 1.00 | 5 | 1.0 | Magnesium hydroxide | 0.58 |
| Comparative Example 1 | α-Aluminum oxide | 1.00 | 18 | 0 | Magnesium oxide | 0.40 |
| Comparative Example 2 | α/θ-Aluminum oxide | 1.00 | 45 | 0 | Magnesium oxide | 0.40 |

The results of the evaluation in Examples 1 to 4 and Comparative Examples 1 to 3 are shown in Table 2 below.

TABLE 2

|  | Average particle diameter (μm) | Molybdenum content (%) | Specific surface area (m²/g) | Diameter of crystallites of [111] plane (nm) | Diameter of crystallites of [311] plane (nm) | Crystalline peak intensity ratio ([111]/[311]) |
| --- | --- | --- | --- | --- | --- | --- |
| Example 1 | 5 | 0.3 | 0.4 | 251 | 281 | 0.363 |
| Example 2 | 20 | 0.30 | 0.02 | 263 | 184 | 0.371 |
| Example 3 | 5 | 0.40 | 0.4 | 364 | 645 | 0.349 |
| Example 4 | 5 | 0.30 | 0.4 | 410 | 530 | 0.330 |
| Comparative Example 1 | 18 | 0 | 0.05 | 216 | 181 | 0.336 |
| Comparative Example 2 | 45 | 0 | 0.05 | 179 | Unanalyzable | 0.360 |
| Comparative Example 3 | <45 | 0 | 1.25 | 159 | 174 | 0.286 |

Table 2 also shows that the spinel particles of Examples 1 to 4 have significantly large diameters of crystallites of the [111] plane. The results indicate that the spinel particles have excellent thermal conductive properties.

The invention claimed is:

1. A spinel particle comprising magnesium, aluminum, and oxygen atoms and molybdenum and having a [111] plane crystallite diameter of 220 nm or more, wherein the molybdenum content in terms of molybdenum oxide based on the spinel particle is 0.3 to 5.0% by mass, and the spinel particle has an average particle diameter of 0.2 to 100 μm.

2. The spinel particle according to claim 1, which has a [311] plane crystallite diameter of 100 nm or more.

3. The spinel particle according to claim 1, which has a ratio of the crystalline peak intensity of the [111] plane to the crystalline peak intensity of the [311] plane ([111] plane/[311] plane) of 0.3 or more.

4. A method for producing the spinel particle according to claim 1, comprising:
   a firing step in which a magnesium compound and an aluminum compound are subjected to solid solution formation and crystallization in the presence of molybdenum so that a spinel particle crystal is grown; and
   a cooling step in which the spinel particle crystal grown in the firing step is crystallized.

5. The production method according to claim 4, wherein the aluminum compound contains molybdenum.

6. The production method according to claim 4, wherein the aluminum compound is aluminum oxide.

7. The production method according to claim 4, wherein the aluminum compound has a molar ratio of molybdenum element to aluminum element (molybdenum element/aluminum element) of 0.00001 to 0.05.

8. The production method according to claim 4, wherein the aluminum compound has an average particle diameter of 0.1 to 1,000 μm.

9. A composition comprising the spinel particle according to claim 1 and a resin.

10. The composition according to claim 9, further comprising a curing agent.

11. The composition according to claim 9, which is a thermally conductive material.

12. A molded article comprising a product obtained by molding the composition according to claim 9.

13. The spinel particle according to claim 2, which has a ratio of the crystalline peak intensity of the [111] plane to the crystalline peak intensity of the [311] plane ([111] plane/ [311] plane) of 0.3 or more.

14. A method for producing the spinel particle according to claim 2, comprising:
- a firing step in which a magnesium compound and an aluminum compound are subjected to solid solution formation and crystallization in the presence of molybdenum so that a spinel particle crystal is grown; and
- a cooling step in which the spinel particle crystal grown in the firing step is crystallized.

15. The production method according to claim 5, wherein the aluminum compound is aluminum oxide.

16. The production method according to claim 5, wherein the aluminum compound has a molar ratio of molybdenum element to aluminum element (molybdenum element/aluminum element) of 0.00001 to 0.05.

17. A composition comprising the spinel particle according to claim 2 and a resin.

* * * * *